US008176781B2

(12) United States Patent
Harigai et al.

(10) Patent No.: US 8,176,781 B2
(45) Date of Patent: May 15, 2012

(54) MULTILAYER PIEZOELECTRIC THIN FILM AND METHOD OF MANUFACTURING THE SAME, ANGULAR VELOCITY SENSOR, PIEZOELECTRIC GENERATING ELEMENT, AND METHOD OF GENERATING ELECTRIC POWER USING THE PIEZOELECTRIC

(75) Inventors: Takakiyo Harigai, Kyoto (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/963,223

(22) Filed: Dec. 8, 2010

(65) Prior Publication Data

US 2011/0072900 A1    Mar. 31, 2011

Related U.S. Application Data

(60) Division of application No. 12/755,180, filed on Apr. 6, 2010, now Pat. No. 7,870,787, which is a continuation of application No. PCT/JP2009/005121, filed on Oct. 2, 2009.

(30) Foreign Application Priority Data

Oct. 24, 2008 (JP) ................. 2008-273795
Nov. 11, 2008 (JP) ................. 2008-288431
Nov. 11, 2008 (JP) ................. 2008-288432

(51) Int. Cl.
*G01C 19/56* (2012.01)
*H01L 41/18* (2006.01)
*H01L 41/047* (2006.01)
*H01L 41/22* (2006.01)
*H02N 2/18* (2006.01)

(52) U.S. Cl. ............ 73/504.16; 310/311; 310/363; 310/339; 29/25.35

(58) Field of Classification Search ............ 73/504.16
See application file for complete search history.

(56) References Cited

U.S. PATENT DOCUMENTS 6,162,293 A    12/2000    Kijima et al.
(Continued)

FOREIGN PATENT DOCUMENTS

EP    0 826 643 A1    3/1998
(Continued)

OTHER PUBLICATIONS

Takenaka, T., et al., "$(Bi_{frax;1;2}Na_{frax;1;2})TiO_3$-$BaTiO_3$ System for Lead-Free Piezoelectric Ceramics", Japanese Journal of Applied Physics, Sep. 1991, pp. 2236-2239, vol. 30 No. 9B.

(Continued)

*Primary Examiner* — Hezron E Williams
*Assistant Examiner* — Gregory J Redmann
(74) *Attorney, Agent, or Firm* — McDermott Will & Emery LLP (57) ABSTRACT

Provided are a piezoelectric thin film including a lead-free ferroelectric material and exhibiting high piezoelectric performance comparable to that of PZT, and a method of manufacturing the piezoelectric thin film. The piezoelectric thin film of the present invention has a multilayer structure in which a metal electrode film having a plane orientation of (100), a $(Bi,Na)TiO_3$ film, and a $(Bi,Na,Ba)TiO_3$ film having a plane orientation of (001) are laminated in this order. The piezoelectric thin film of the present invention can be applied to a wide range of fields and uses. For example, with the piezoelectric thin film of the present invention, an angular velocity sensor of the present invention having high sensitivity and a piezoelectric generating element of the present invention having excellent power generation characteristics can be constructed.

14 Claims, 7 Drawing Sheets

U.S. PATENT DOCUMENTS

| | | |
|---|---|---|
| 6,523,943 B1 | 2/2003 | Fukui |
| 6,692,569 B2 | 2/2004 | Roeder et al. |
| 6,711,793 B2 | 3/2004 | Sumi |
| 7,090,785 B2 * | 8/2006 | Chiang et al. ............ 252/62.9 R |
| 7,185,540 B2 * | 3/2007 | Torii et al. .................. 73/504.16 |
| 2004/0090500 A1 | 5/2004 | Murai |
| 2005/0253904 A1 | 11/2005 | Miyazawa et al. |
| 2008/0157629 A1 | 7/2008 | Noguchi et al. |
| 2009/0021119 A1 | 1/2009 | Yasumi et al. |
| 2009/0044624 A1 | 2/2009 | Hayashi et al. |
| 2009/0230211 A1 | 9/2009 | Kobayashi et al. |
| 2009/0244203 A1 | 10/2009 | Mita |

FOREIGN PATENT DOCUMENTS

| | | |
|---|---|---|
| JP | 04-060073 | 2/1992 |
| JP | 04-060073 B | 9/1992 |
| JP | 10-139552 | 5/1998 |
| JP | 10-182291 | 7/1998 |
| JP | 11-180769 | 7/1999 |
| JP | 2002-265300 | 9/2002 |
| JP | 2006-086368 | 3/2006 |
| JP | 2007-266346 | 10/2007 |

OTHER PUBLICATIONS

Scarisoreanu, N., et al., "Pulsed laser deposition of perovskite relaxor ferroelectric thin films", Applied Surface Science, 2006, pp. 4553-4557, vol. 252, Elsevier B.V.

Fujii, E., et al., "Preparation of (001)-Oriented Pb(Zr,Ti) $O_3$ Thin Films and Their Piezoelectric Applications", IEEE Transactions on Ultrasonics, Ferroelectronics, and Frequency Control, Dec. 2007, pp. 2431-2438, vol. 54 No. 12, IEEE.

* cited by examiner

MULTILAYER PIEZOELECTRIC THIN FILM AND METHOD OF MANUFACTURING THE SAME, ANGULAR VELOCITY SENSOR, PIEZOELECTRIC GENERATING ELEMENT, AND METHOD OF GENERATING ELECTRIC POWER USING THE PIEZOELECTRIC

This Application is a Divisional of U.S. patent application Ser. No. 12/755,180, filed on Apr. 6, 2010, now U.S. Pat No. 7,870,787 which is a Continuation of International Application No. PCT/JP2009/005121, filed on Oct. 2, 2009 which in turn claims the benefit of Japanese Patent Application No. 2008-273795, filed on Oct. 24, 2008, Japanese Patent Application No. 2008-288431, filed on Nov. 11, 2008 and Japanese Patent Application No. 2008-288432, filed on Nov. 11, 2008, the entire contents of each of which are hereby incorporated by reference.

BACKGROUND OF THE INVENTION

1. Field of the Invention

The present invention relates to a piezoelectric thin film and a method of manufacturing the same. The present invention also relates to an angular velocity sensor including a piezoelectric thin film, and a method of measuring an angular velocity by the sensor, and to a piezoelectric generating element including a piezoelectric thin film, and a method of generating electric power using the element.

2. Description of Related Art

Lead zirconate titanate (PZT: $Pb(Zr_xTi_{1-x})O_3$, $0<X<1$) is a typical ferroelectric material capable of storing a large amount of electric charge, and used in capacitors and thin film memories. PZT exhibits pyroelectricity and piezoelectricity based on the ferroelectricity thereof. Because of not only its high piezoelectric performance but also easy adjustability of its mechanical quality factor Qm achieved by adjusting the composition or doping an element, PZT is used in a wide variety of applications such as sensors, actuators, ultrasonic motors, filter circuits, and oscillators.

On the other hand, PZT contains a large amount of lead as one of its constituent elements. In recent years, there has been a growing concern that lead leached from waste devices may cause serious damage to the ecosystem and the environment. Accordingly, there has been an international movement toward restricting the use of lead, but PZT cannot meet the requirement for this restriction. For this reason, lead-free ferroelectric materials have been in demand.

One of the lead-free ferroelectric materials that are currently under development is a perovskite-type composite oxide $[(Bi_{0.5}Na_{0.5})_{1-Y}Ba_Y]TiO_3$ containing bismuth (Bi), sodium (Na), barium (Ba), and titanium (Ti). It has been reported that this material exhibits high piezoelectric performance of about 125 pC/N in terms of a piezoelectric constant d33, although lower than that of PZT, when the content of barium Y (=[Ba/(Bi+Na+Ba)] is 5 to 10% (see JP 4 (1992)-60073 B, and T. Takenaka et al., Japanese Journal of Applied Physics, Vol. 30, No. 9B, (1991), pp. 2236-2239).

In JP 2007-266346 A (particularly paragraphs 0034, and 0052 to 0054) and N. Scarisoreanu et al., Applied Surface Science, Vol. 252, (2006), pp. 4553-4557, attempts to produce a $(Bi,Na,Ba)TiO_3$ film that is oriented in a specific direction have been made. It is expected that the alignment of the polarization axes in the $(Bi,Na,Ba)TiO_3$ film with the orientation improves the ferroelectric properties of the film, such as remanent polarization and piezoelectric performance. JP 2007-266346 A describes that when a $LaNiO_3$ (LNO) film or a $SrRuO_3$ (SRO) film having a plane orientation of (100) is formed on an electrode and a $(Bi,Na,Ba)TiO_3$ film is formed further thereon, the resulting $(Bi,Na,Ba)TiO_3$ film is oriented in the (100) direction. Scarisoreanu et al., Applied Surface Science, Vol. 252, (2006), pp. 4553-4557 describe that when a $(Bi,Na,Ba)TiO_3$ film is formed on a MgO substrate having a plane orientation of (100) by pulsed laser deposition (PLD), the resulting $(Bi,Na,Ba)TiO_3$ film is slightly oriented in the (100) direction.

JP 10(1998)-182291 A describes that a substrate having a surface on which a buffer layer is formed controls the orientation of a $Bi_4Ti_3O_{12}$ ferroelectric film (see particularly paragraph 0020), although it does not refer to a $(Bi,Na,Ba)TiO_3$ film. Preferably, the buffer layer described in this publication contains all or a part of the constituent elements of the ferroelectric film to be formed thereon.

SUMMARY OF THE INVENTION

It is an object of the present invention to provide a piezoelectric thin film including a lead-free ferroelectric material and exhibiting high piezoelectric performance comparable to that of PZT, and a method of manufacturing the piezoelectric thin film.

It is another object of the present invention to provide an angular velocity sensor and a piezoelectric generating element each including a lead-free ferroelectric material exhibiting high piezoelectric performance comparable to that of PZT, and to provide a method of measuring an angular velocity by this angular velocity sensor and a method of generating electric power using this piezoelectric generating element.

The present inventors have discovered that the formation of a $(Bi,Na)TiO_3$ film as an interface layer on a metal electrode film having a plane orientation of (100), and the formation of a $(Bi,Na,Ba)TiO_3$ film as a piezoelectric layer further thereon allow the resulting $(Bi,Na,Ba)TiO_3$ film to have high (001) orientation and crystallinity and to exhibit high piezoelectric performance.

That is, a piezoelectric thin film of the present invention includes: a metal electrode film having a plane orientation of (100); a $(Bi,Na)TiO_3$ film; and a $(Bi,Na,Ba)TiO_3$ film having a plane orientation of (001). This piezoelectric thin film has a multilayer structure in which the metal electrode film, the $(Bi,Na)TiO_3$ film, and the $(Bi,Na,Ba)TiO_3$ film are laminated in this order.

A method of manufacturing a piezoelectric thin film of the present invention is a method including steps of: forming a $(Bi,Na)TiO_3$ film on a surface of a metal electrode film having a plane orientation of (100) by sputtering; and forming a $(Bi,Na,Ba)TiO_3$ film having a plane orientation of (001) on the $(Bi,Na)TiO_3$ film by sputtering to obtain a piezoelectric thin film having a multilayer structure in which the metal electrode film, the $(Bi,Na)TiO_3$ film, and the $(Bi,Na,Ba)TiO_3$ film are laminated in this order.

An angular velocity sensor of the present invention includes: a substrate having a vibration part; and a piezoelectric thin film bonded to the vibration part. The piezoelectric thin film includes: a piezoelectric layer; first and second electrodes that sandwich the piezoelectric layer therebetween; and an interface layer sandwiched between the first electrode and the piezoelectric layer. The first electrode is formed of a metal electrode film having a plane orientation of (100). The interface layer is formed of a $(Bi,Na)TiO_3$ film. The piezoelectric layer is formed of a $(Bi,Na,Ba)TiO_3$ film having a plane orientation of (001). One of the first and second electrodes selected therefrom is constituted of an electrode group including a drive electrode for applying a driving voltage that oscillates the vibration part to the piezoelectric layer and a sense electrode for measuring a deformation of the vibration part caused by an angular velocity applied to the oscillating vibration part.

A method of measuring an angular velocity of the present invention is a method of measuring an angular velocity by an angular velocity sensor. In this method, the angular velocity sensor includes: a substrate having a vibration part; and a piezoelectric thin film bonded to the vibration part. The piezoelectric thin film includes: a piezoelectric layer; first and second electrodes that sandwich the piezoelectric layer therebetween; and an interface layer sandwiched between the first electrode and the piezoelectric layer. The first electrode is formed of a metal electrode film having a plane orientation of (100). The interface layer is formed of a $(Bi,Na)TiO_3$ film. The piezoelectric layer is formed of a $(Bi,Na,Ba)TiO_3$ film having a plane orientation of (001). One of the first and second electrodes selected therefrom is constituted of an electrode group including a drive electrode and a sense electrode. This measuring method includes steps of: applying a driving voltage to the piezoelectric layer through the drive electrode and the other of the first and second electrodes selected therefrom to oscillate the vibration part; and measuring, through the other electrode and the sense electrode, a deformation of the vibration part caused by an angular velocity applied to the oscillating vibration part to obtain a value of the applied angular velocity.

A piezoelectric generating element of the present invention includes: a substrate having a vibration part; and a piezoelectric thin film bonded to the vibration part. The piezoelectric thin film includes: a piezoelectric layer; first and second electrodes that sandwich the piezoelectric layer therebetween; and an interface layer sandwiched between the first electrode and the piezoelectric layer. The first electrode is formed of a metal electrode film having a plane orientation of (100). The interface layer is formed of a $(Bi,Na)TiO_3$ film. The piezoelectric layer is formed of a $(Bi,Na,Ba)TiO_3$ film having a plane orientation of (001).

In a method of generating electric power of the present invention using a piezoelectric generating element, the piezoelectric generating element includes: a substrate having a vibration part; and a piezoelectric thin film bonded to the vibration part. The piezoelectric thin film includes: a piezoelectric layer; first and second electrodes that sandwich the piezoelectric layer therebetween; and an interface layer sandwiched between the first electrode and the piezoelectric layer. The first electrode is formed of a metal electrode film having a plane orientation of (100). The interface layer is formed of a $(Bi,Na)TiO_3$ film. The piezoelectric layer is formed of a $(Bi,Na,Ba)TiO_3$ film having a plane orientation of (001). This electric power generating method includes a step of vibrating the vibration part to obtain electric power through the first and second electrodes.

The present invention realizes a piezoelectric thin film including a piezoelectric layer composed of a lead-free ferroelectric material $(Bi,Na,Ba)TiO_3$ with high (001) orientation and crystallinity and exhibiting high piezoelectric performance comparable to that of PZT.

The present invention also realizes an angular velocity sensor and a piezoelectric generating element each including a lead-free ferroelectric material exhibiting high piezoelectric performance comparable to that of PZT, and a method of measuring an angular velocity by this sensor and a method of generating electric power using this element. This angular velocity sensor has high sensitivity and this piezoelectric generating element has excellent power generation characteristics. The method of measuring an angular velocity by this sensor achieves high angular velocity measurement sensitivity, and the method of generating electric power using this element achieves high electric power generation efficiency.

DETAILED DESCRIPTION OF THE INVENTION

Piezoelectric Thin Film and Method of Manufacturing Piezoelectric Thin Film

Figure 1:
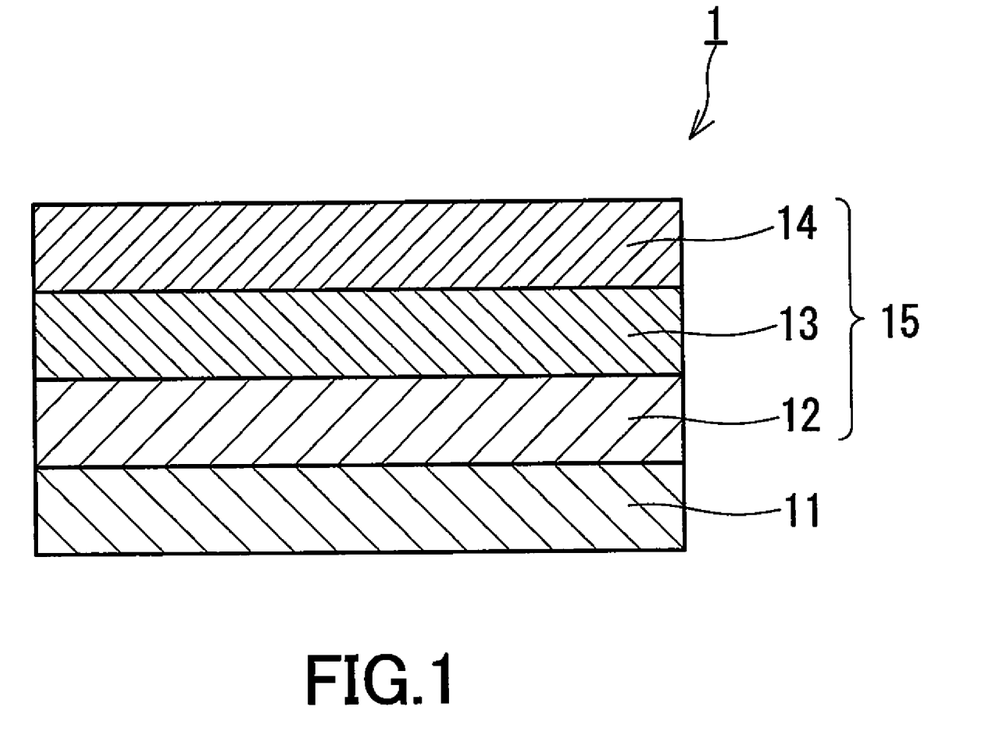
FIG. 1 is a cross-sectional view schematically showing an example of a piezoelectric thin film of the present invention.

FIG. 1 shows an example of a piezoelectric thin film of the present invention. A piezoelectric thin film 1 shown in FIG. 1 has a multilayer structure 15 in which a metal electrode film 12 having a plane orientation of (100), a $(Bi,Na)TiO_3$ film 13, and a $(Bi,Na,Ba)TiO_3$ film 14 having a plane orientation of (001) are laminated in this order. The multilayer structure 15 is formed on a substrate 11. In the multilayer structure 15, the $(Bi,Na)TiO_3$ film 13 is placed in contact with the metal electrode film 12 having a plane orientation of (100), and the $(Bi,Na,Ba)TiO_3$ film 14 is placed in contact with the $(Bi,Na)TiO_3$ film 13. The crystallinity and the (001) orientation of this $(Bi,Na,Ba)TiO_3$ film 14 are very high. This allows the piezoelectric thin film 1 to exhibit high piezoelectric performance comparable to that of PZT, although it contains no lead.

The metal electrode film 12 with a plane orientation of (100) is necessary to form the $(Bi,Na,Ba)TiO_3$ film 14 having high (001) orientation and crystallinity with the aid of the $(Bi,Na)TiO_3$ film 13 formed in contact with the metal electrode film 12. The material of the metal electrode film 12 is not particularly limited as long as the plane orientation of the surface of the metal electrode film 12 is (100). Examples of such materials include platinum (Pt), palladium (Pd), gold (Au), nickel oxide (NiO), ruthenium oxide ($RuO_2$), iridium oxide ($IrO_2$), and strontium ruthenate ($SrRuO_3$). The metal electrode film 12 may be composed of two or more of these materials. Preferably, the metal electrode film 12 has a low electrical resistance and a high heat resistance. From this viewpoint, the metal electrode film is preferably composed of platinum (Pt).

The metal electrode film 12 having a plane orientation of (100) can be formed, for example, by epitaxial growth thereof on the surface of a suitable base substrate selected for the metal electrode film 12 to be obtained. Various thin film formation techniques such as sputtering can be applied for the epitaxial growth of the metal electrode film 12. In such a technique, the conditions for allowing the epitaxial growth of the metal electrode film 12 to proceed are selected as the thin film formation conditions. The epitaxial growth of the metal electrode film 12 is affected mainly by the lattice constant and thermal expansion coefficient of the base substrate.

Preferably, the base substrate has a NaCl type crystal structure with a surface having a plane orientation of (001), such as a magnesium oxide (MgO) substrate. The base substrate may be one of the following substrates: a substrate made of an oxide having a perovskite structure, such as $SrTiO_3$, $LaAlO_3$, and $NdGaO_3$; a substrate made of an oxide having a corundum structure, such as $Al_2O_3$; a substrate made of an oxide having a spinel structure, such as $MgAl_2O_4$; a substrate made of an oxide having a rutile structure, such as $TiO_2$; and a substrate made of an oxide having a cubic crystal structure, such as $(La,Sr)(Al,Ta)O_3$, and yttria-stabilized zirconia (YSZ). The base substrate may have a structure in which an oxide thin film having a NaCl type crystal structure with a surface having a plane orientation of (001) is placed on the surface of a silicon (Si) substrate, a glass substrate, a ceramic substrate such as an alumina substrate, or a metal substrate such as a stainless steel substrate, and integrated with these substrates. In this case, the metal electrode film 12 is formed on the surface of the oxide thin Mm. Examples of the oxide thin film include a MgO thin film, a nickel oxide (NiO) thin film, and a cobalt oxide (CoO) thin film.

The piezoelectric thin film 1 shown in FIG. 1 has a substrate 11. To obtain such a piezoelectric thin film, the base substrate used for the formation of the metal electrode film 12 may be used as the substrate 11 without any modification. The piezoelectric thin film of the present invention need not always have a substrate. To obtain a piezoelectric thin film not having a substrate, the base substrate used for the formation of the metal electrode film 12 is removed by a technique such as etching at an arbitrary point in time in the process of forming the piezoelectric thin film, for example, after the $(Bi,Na)TiO_3$ film 13 and the $(Bi,Na,Ba)TiO_3$ film 14 are formed on the metal electrode film 12. A multilayer body, from which the base substrate has been removed, including the metal electrode film 12, the $(Bi,Na)TiO_3$ film 13, and the $(Bi,Na,Ba)TiO_3$ film 14 may be placed on another substrate 11 so as to form a piezoelectric thin film 1 having the substrate 11. In the case where this multilayer body is placed on the substrate 11 such that the metal electrode film 12 is in contact with the substrate 11, the piezoelectric thin film 1 having the structure shown in FIG. 1 is obtained. The above-mentioned multilayer body may be placed on the substrate 11 such that the $(Bi,Na,Ba)TiO_3$ film 14 is in contact with the substrate 11. In this case, the positional relationship between the $(Bi,Na)TiO_3$ film 13 and the $(Bi,Na,Ba)TiO_3$ film 14 with respect to the substrate 11 is reversed from that in the piezoelectric thin film 1 shown in FIG. 1.

In the case where the base substrate is used as the substrate 11, the substrate 11 is, for example, a MgO substrate.

That is, the piezoelectric thin film of the present invention further may include the substrate 11 so that the multilayer structure 15 is formed on that substrate 11. The substrate 11 is, for example, a MgO substrate.

The $(Bi,Na)TiO_3$ film 13 is a film composed of $(Bi,Na)TiO_3$. In the piezoelectric thin film of the present invention, the $(Bi,Na)TiO_3$ film 13 is an interface layer placed between and in contact with the metal electrode film 12 and the $(Bi,Na,Ba)TiO_3$ film 14. The $(Bi,Na)TiO_3$ film 13 is necessary to form the $(Bi,Na,Ba)TiO_3$ film 14 having high (001) orientation and crystallinity.

The composition of the interface layer on which a piezoelectric layer having high crystallinity and high orientation is formed cannot be estimated simply from the similarity to the lattice constants or the compositions of both of these layers. In other words, a piezoelectric layer having high crystallinity and high orientation cannot be obtained simply by providing an interface layer having a lattice constant or a composition similar to that of the piezoelectric layer. This is because it is generally difficult to form a highly crystalline film and a highly oriented film composed of a multicomponent composite oxide like $(Bi,Na,Ba)TiO_3$, due to a difference in the vapor pressure of each constituent element (except for oxygen) of the oxide.

The thickness of the $(Bi,Na)TiO_3$ film 13 is not particularly limited. The thickness of at least several lattice units (about 2 nm) is large enough to form the $(Bi,Na,Ba)TiO_3$ film 14 having high (001) orientation and crystallinity.

The $(Bi,Na)TiO_3$ film 13 has a perovskite-type crystal structure represented by the general formula $ABO_3$. The A site and B site in the perovskite structure each have an average valence of 2 or 4 depending on the placement of a single or a plurality of elements. In $(Bi,Na)TiO_3$, Bi and Na are present in the A site, and Ti is present in the B site. The $(Bi,Na)TiO_3$ film 13 sometimes includes a trace amount of impurities. The impurities typically are Li and K to substitute for Na in the A site, and Zr to substitute for Ti in the B site. The impurities also are, for example, Mn, Fe, Nb, and Ta. Some of these impurities improve the crystallinity of the $(Bi,Na)TiO_3$ film 13.

The method of forming the $(Bi,Na)TiO_3$ film 13 is not particularly limited. Well-known thin film formation techniques, for example, sputtering, pulsed laser deposition (PLD), chemical vapor deposition (CVD), sol-gel processing, and aerosol deposition (AD), can be employed. In the method of manufacturing a piezoelectric thin film of the present invention, sputtering is used to form the $(Bi,Na)TiO_3$ film 13 on the surface of the metal electrode film 12 having a plane orientation of (100). The $(Bi,Na)TiO_3$ film 13 grows epitaxially on the metal electrode film 12 having a plane orientation of (100), and the surface of the film 13 has a plane orientation of (001).

The $(Bi,Na,Ba)TiO_3$ film 14 is composed of $(Bi,Na,Ba)TiO_3$, and the surface of the film 14 has a plane orientation of (001).

The thickness of the $(Bi,Na,Ba)TiO_3$ film 14 is not particularly limited. The thickness thereof is 0.5 to 10 μm, for example. Although the $(Bi,Na,Ba)TiO_3$ film 14 that is a piezoelectric layer is such a thin film, it exhibits high piezoelectric performance, and therefore the piezoelectric thin film of the present invention has sufficient practical utility.

The $(Bi,Na,Ba)TiO_3$ film 14 has a perovskite-type crystal structure represented by the general formula $ABO_3$. The A site and B site in the perovskite structure each have an average valence of 2 or 4 depending on the placement of a single or a plurality of elements. In $(Bi,Na,Ba)TiO_3$, Bi, Na and Ba are present in the A site, and Ti is present in the B site. The $(Bi,Na,Ba)TiO_3$ film 14 sometimes includes a trace amount of impurities. The impurities typically are Li and K to substitute for Na, and Sr and Ca to substitute for Ba in the A site, and Zr to substitute for Ti in the B site. The impurities also are, for example, Mn, Fe, Nb, and Ta. Some of these impurities improve the crystallinity of the $(Bi,Na,Ba)TiO_3$ film 14, which improves the piezoelectric performance thereof.

The method of forming the (Bi,Na,Ba)TiO₃ film 14 is not particularly limited. Well-known thin film formation techniques, for example, sputtering, PLD, CVD, sol-gel processing, and AD can be employed. In the method of manufacturing a piezoelectric thin film of the present invention, sputtering is used to form the (Bi,Na,Ba)TiO₃ film 14 on the surface of the (Bi,Na)TiO₃ film 13. The (Bi,Na,Ba)TiO₃ film 14 grows epitaxially on the (Bi,Na)TiO₃ film 13, and the surface of the film 14 has a plane orientation of (001).

The piezoelectric thin film of the present invention may have an arbitrary layer in addition to the substrate 11, the metal electrode film 12, the (Bi,Na)TiO₃ film 13, and the (Bi,Na,Ba)TiO₃ film 14, if necessary. Such a piezoelectric thin film can be formed, for example, by adding a step of forming the arbitrary layer to the manufacturing method of the present invention. The arbitrary layer is, for example, an electrode (second electrode) that sandwiches the (Bi,Na)TiO₃ film 13 and the (Bi,Na,Ba)TiO₃ film 14 with the metal electrode film 12. This electrode may be made of any material as long as it has conductivity. For example, it does not have to be made of metal.

In the method of manufacturing a piezoelectric thin film of the present invention, the (Bi,Na)TiO₃ film 13 is formed by sputtering on the surface of the metal electrode film 12 having a plane orientation of (100), and the (Bi,Na,Ba)TiO₃ film 14 having a plane orientation of (001) is formed by sputtering on the surface of the (Bi,Na)TiO₃ film 13 thus formed, so as to obtain the piezoelectric thin film 1 having the multilayer structure 15 including the metal electrode film 12, the (Bi,Na)TiO₃ film 13, and the (Bi,Na,Ba)TiO₃ film 14. The piezoelectric thin film 1 containing no lead but exhibiting high piezoelectric performance comparable to that of PZT is obtained in this manner.

In the method of manufacturing a piezoelectric thin film of the present invention, the (Bi,Na)TiO₃ film 13 may be formed on the surface of the metal electrode film 12 formed on the base substrate, as described above. In this case, if the base substrate is used as the substrate 11, the piezoelectric thin film 1 further including the substrate 11, on which the multilayer structure 15 is formed, is obtained. Another substrate may be placed after removing the base substrate to obtain a piezoelectric thin film further including the substrate, on which the multilayer structure 15 is formed. The another substrate may be placed in contact with the metal electrode film 12 in the multilayer structure 15, or may be placed in contact with the (Bi,Na,Ba)TiO₃ film 14 therein.

The preferred base substrate and substrate are those described above.

The (Bi,Na)TiO₃ film 13 and the (Bi,Na,Ba)TiO₃ film 14 to be formed are those described above.

The method of manufacturing a piezoelectric thin film of the present invention may include an arbitrary step in addition to the above-mentioned steps. The arbitrary step is, for example, a step of forming a second electrode on the (Bi,Na,Ba)TiO₃ film 14 so that the second electrode and the metal electrode film 12 sandwich the (Bi,Na)TiO₃ film 13 and the (Bi,Na,Ba)TiO₃ film 14 therebetween.

[Angular Velocity Sensor]

Figure 2:
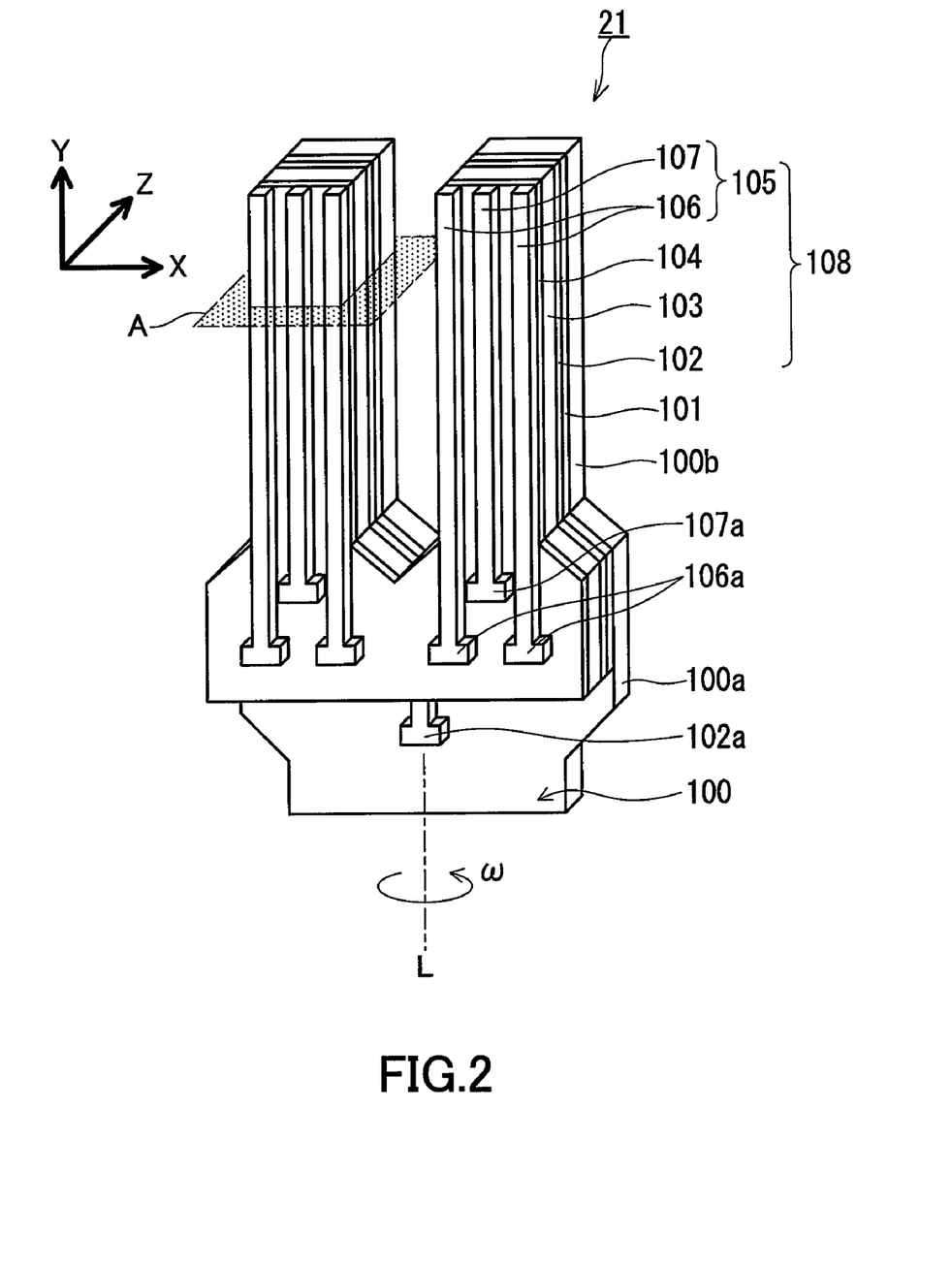
FIG. 2 is a perspective view schematically showing an example of an angular velocity sensor of the present invention.
Figure 3:
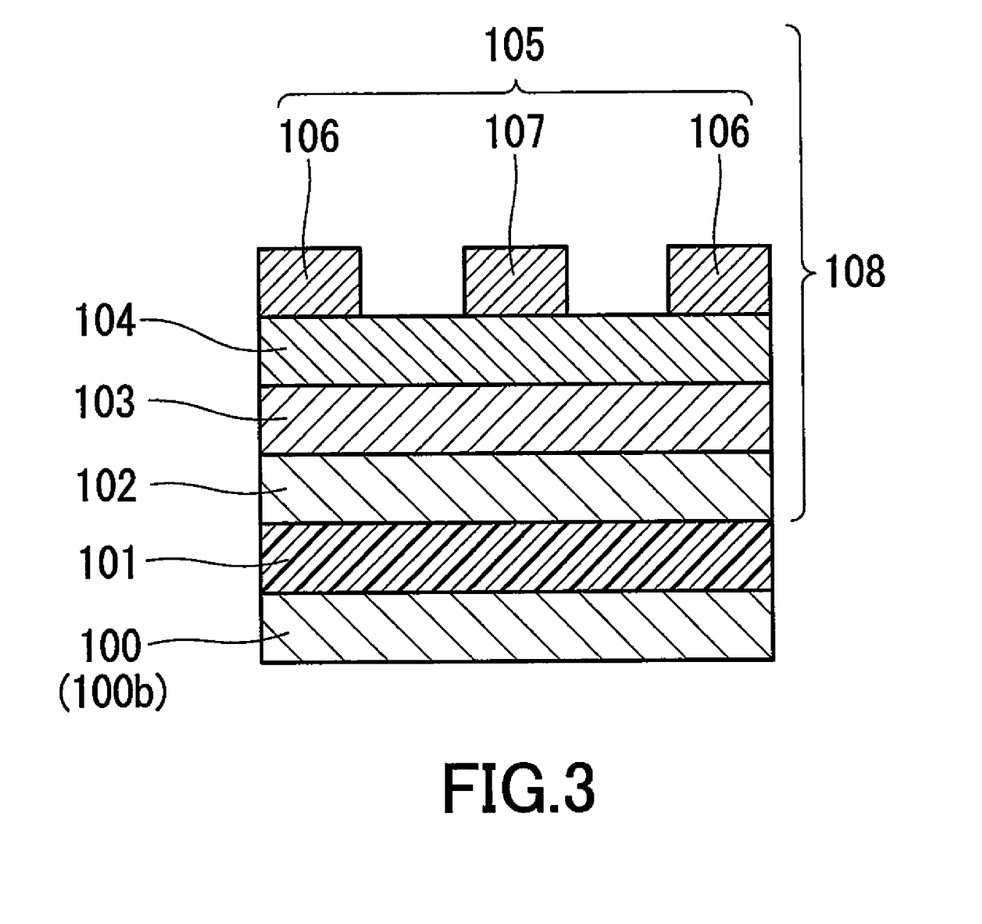
FIG. 3 is a cross-sectional view showing a cross section A of the angular velocity sensor shown in FIG. 2.

FIGS. 2 and 3 show an example of an angular velocity sensor of the present invention. FIG. 3 shows a cross section A of an angular velocity sensor 21 shown in FIG. 2. The angular velocity sensor 21 shown in FIGS. 2 and 3 is a so-called tuning-fork type angular velocity sensor, and is suitably used for any purpose, such as a navigation apparatus for a vehicle, and a sensor for a digital still camera for correcting image blurring due to hand movement.

The angular velocity sensor 21 shown in FIGS. 2 and 3 includes a substrate 100 having vibration parts 100b and piezoelectric thin films 108 bonded to the vibration parts 100b.

The substrate 100 has a stationary part 100a and a pair of vibration parts 100b extending in a predetermined direction from the stationary part 100a. The direction in which the vibration parts 100b extend is the direction in which the central axis of rotation L of the angular velocity detected by the angular velocity sensor 21 extends, that is, the Y direction in the example shown in FIG. 2. The substrate 100 including the stationary part 100a and the pair of vibration parts 100b has a shape of a tuning fork, in which the pair of vibration parts 100b correspond to the arms of the tuning fork, when viewed in the thickness direction of the substrate 100 (the Z direction in FIG. 2). The pair of vibration parts 100b are arranged side by side along the width direction thereof (the X direction in FIG. 2) and extend parallel to each other.

The material of the substrate 100 is not particularly limited. The material is, for example, silicon, glass, ceramic, or metal. The thickness of the substrate 100 may be any desired thickness as long as the functions of the angular velocity sensor 21 develop. The thickness is, for example, 0.1 to 0.7 mm. The thickness of the stationary part 100a may be different from that of the vibration part 100b.

The piezoelectric thin film 108 is bonded to the vibration part 100b with an adhesive layer 101. The piezoelectric thin film 108 includes a piezoelectric layer 103, a first electrode 105 and a second electrode 102, and an interface layer 104. The piezoelectric layer 103 is sandwiched between the first electrode 105 and the second electrode 102. The interface layer 104 is placed between and in contact with the first electrode 105 and the piezoelectric layer 103.

The first electrode 105 is a metal electrode film having a plane orientation of (100). The interface layer 104 is a (Bi,Na)TiO₃ film. The piezoelectric layer 103 is a (Bi,Na,Ba)TiO₃ film. The first electrode 105, the interface layer 104, and the piezoelectric layer 103 in the piezoelectric thin film 108 correspond to the above-mentioned piezoelectric thin film 1 of the present invention. The piezoelectric thin film 108 has a structure including the piezoelectric thin film 1 and the second electrode 102 added thereto.

The first electrode 105 is constituted of an electrode group including a drive electrode 106 for applying a driving voltage that oscillates the vibration part 100b to the piezoelectric layer 103 and a sense electrode 107 for measuring a deformation of the vibration part 100b caused by an angular velocity applied to the oscillating vibration part 100b. In other words, the first electrode 105 is patterned into the electrode group including the drive electrode 106 and the sense electrode 107. How the first electrode 105 is patterned is not particularly limited as long as the functions of the drive electrode and the sense electrode are obtained. The vibration part 100b usually oscillates in the width direction thereof (the X direction in FIG. 2). In the example shown in FIGS. 2 and 3, a pair of drive electrodes 106 are provided on both of the width-direction edge portions of the vibration part 100b along the length direction thereof (the Y direction in FIG. 2). Only one drive electrode 106 may be provided on one of the width-direction edge portions of the vibration part 100b. The sense electrode 107 is provided to measure the deformation of the vibration part 100b caused by an angular velocity. In the example shown in FIGS. 2 and 3, the sense electrode 107 is provided between the pair of drive electrodes 106 along the length direction of the vibration part 100b. A plurality of sense electrodes 107 may be provided on the vibration part 100b. The deformation of the vibration part 100b measured by the sense electrode 107 usually is a deflection in the thickness direction thereof (the Z direction in FIG. 2).

In the angular velocity sensor of the present invention, one of the first and second electrodes selected therefrom is constituted of an electrode group including the drive electrode and the sense electrode.

The first electrode 105 may be the same as the metal electrode film 12 described above in the explanation of the piezoelectric thin film of the present invention. The first electrode 105 is, for example, a Pt electrode film.

The second electrode 102 is not particularly limited as long as it has conductivity. The second electrode 102 is, for example, a copper (Cu) electrode (electrode film). The Cu electrode is preferable for the second electrode 102 because of its excellent adhesion to the piezoelectric layer 103. The second electrode may be a Pt electrode (film) or a gold (Au) electrode (film) having on its surface an adhesive layer made of a conductive material, such as titanium (Ti), having excellent adhesion to the piezoeletric layer 103.

The second electrode 102, the drive electrode 106, and the sense electrode 107 have connection terminals 102a, 106a, and 107a, respectively, formed at the end portions thereof. The shape and position of each of the connection terminals are not particularly limited. In the example shown in FIG. 2, the connection terminals are positioned on the stationary part 100a.

The material of the adhesive layer 101 is not particularly limited as long as the adhesive layer 101 bonds stably the vibration part 100b of the substrate 100 to the piezoelectric thin film 108. For example, the material of the adhesive layer 101 is an acrylic resin adhesive, an epoxy resin adhesive, a silicone adhesive, or a polyimide adhesive.

In the angular velocity sensor of the present invention, the preferred thicknesses of the adhesive layer 101, the second electrode 102, the piezoelectric layer 103, the interface layer 104, and the first electrode 105 are 0.2 to 1 µm, 0.1 to 0.5 µm, 0.5 to 5 µm, 0.05 to 0.5 µm, and 0.1 to 0.5 µm, respectively.

In the example shown in FIGS. 2 and 3, the piezoelectric layer 103, the interface layer 104, and the first electrode 105 are laminated in this order when viewed from the substrate 100 having the vibration parts 100b. In the angular velocity sensor of the present invention, however, the order of lamination of these layers may be reversed. Specifically, the first electrode, the interface layer, and the piezoelectric layer may be laminated in this order when viewed from the substrate having the vibration parts.

In the example shown in FIGS. 2 and 3, the piezoelectric thin film 108 is bonded to both the vibration part 100b and the stationary part 100a of the substrate 100. In the angular velocity sensor of the present invention, the state in which the piezoelectric thin film 108 is bonded to the vibration part 100b is not particularly limited as long as the piezoelectric thin film 108 can oscillate the vibration part 100b and measure the deformation of the vibration part 100b. For example, the piezoelectric thin film 108 may be bonded only to the vibration part 100b.

The angular velocity sensor of the present invention may include a plurality of pairs of vibration parts 100b (although the example of shown in FIGS. 2 and 3 includes a pair of vibration parts 100b that constitute the arms of the tuning fork). In the case where the angular velocity sensor includes a plurality of pairs of vibration parts 100b, it is a biaxial or triaxial angular velocity sensor capable of measuring angular velocities with respect to a plurality of rotation axes.

The angular velocity sensor of the present invention may have an arbitrary layer or an arbitrary member at an arbitrary position, as long as the first electrode, the interface layer, and the piezoelectric layer are laminated in this order and the angular velocity can be measured by the sensor.

The above-mentioned method of manufacturing a piezoelectric thin film of the present invention can be applied to the manufacture of the angular velocity sensor of the present invention. For example, the angular velocity sensor can be manufactured in the following manner.

First, a metal electrode film having a plane orientation of (100) as a first electrode, a $(Bi,Na)TiO_3$ film as an interface layer, a $(Bi,Na,Ba)TiO_3$ film having a plane orientation of (001) as a piezoelectric layer, and a second electrode are formed on a base substrate in this order. The base substrate is, for example, a MgO substrate. The metal electrode film is, for example, a Pt electrode film. Well-known thin film formation techniques can be employed to form the respective layers. For example, they are formed by sputtering.

Next, a multilayer body thus formed is bonded to the substrate of an angular velocity sensor via an adhesive layer. The substrate is, for example, a Si substrate. The multilayer body is bonded to the substrate such that the substrate and an exposed layer of the multilayer body (the second electrode of the multilayer body formed as described above) on the side opposite to the base substrate are bonded to each other.

Next, the base substrate is removed by a technique such as etching. The etching is wet etching using phosphoric acid, for example. This etching may be performed at about 60° C.

Next, the first electrode that has been exposed by removing the base substrate is patterned using a microfabrication technique to form a drive electrode and a sense electrode. Besides, the interface layer, the piezoelectric layer, and the second electrode are patterned using the same microfacrication technique, and the substrate is patterned to form a vibration part. A well-known microfacrication technique for thin films, such as etching, can be employed as the above microfabrication. The angular velocity sensor of the present invention can be manufactured in this manner.

[Method of Measuring Angular Velocity by Angular Velocity Sensor]

A method of measuring an angular velocity of the present invention is a method in which in the above-mentioned angular velocity sensor of the present invention, a driving voltage is applied to the piezoelectric layer to oscillate the vibration part of the substrate, and a deformation of the vibration part caused by an angular velocity applied to the oscillating vibration part is measured to obtain a value of the applied angular velocity. To apply the driving voltage to the piezoelectric layer, it is applied between the drive electrode and one of the first electrode and the second electrode (the other electrode) that has not been patterned into the drive electrode nor the sense electrode. The deformation of the oscillating vibration part caused by the angular velocity is measured through the sense electrode and the other electrode.

Hereinafter, the method is described with reference to the angular velocity sensor 21 shown in FIG. 2. In order to oscillate the vibration part 100b, a driving voltage having a frequency that resonates with the natural vibration of the vibration part 100b is applied to the piezoelectric layer 103 through the second electrode 102 and the drive electrode 106. The piezoelectric layer 103 is deformed in accordance with the waveform of the applied driving voltage, and the vibration part 100b bonded to the piezoelectric layer 103 oscillates. The driving voltage can be applied, for example, by changing the potential of the driving electrode 106 while grounding the second electrode 102. The angular velocity sensor 21 includes a pair of vibration parts 100b that constitute the arms of the tuning fork. Usually, in such an angular velocity sensor, reverse (positive and negative) voltages are applied to the drive electrodes 106 provided on the respective vibration parts 100*b* of the pair. As a result, the respective vibration parts 100*b* oscillate in the mode in which they vibrate in the directions opposite to each other (the mode in which they vibrate symmetrically with respect to the central axis of rotation L shown in FIG. 2). In the case where the shape of the vibration parts 100*b*, and the arrangement of the drive electrodes and the sense electrodes are those shown in FIG. 2, the vibration parts 100*b* oscillate in the width direction thereof (the X direction). The angular velocity can be measured by oscillating only one of the pair of vibration parts 100*b*.

For accurate measurement, however, it is preferable to oscillate both of the vibration parts in the mode in which they vibrate in the directions opposite to each other.

If an angular velocity ω with respect to the central axis of rotation L is applied to the angular velocity sensor 21 in which the vibration parts 100*b* are oscillating, the vibration parts 100*b* are deflected respectively in the thickness direction thereof (the Z direction) by Coriolis force. In the case where the respective vibration parts 100*b* are oscillating in the opposite direction mode, they are deflected in the opposite directions by the same degree. The piezoelectric layer 103 bonded to the vibration part 100*b* is also deflected according to this deflection of the vibration part 100*b*. As a result, a potential difference is generated between the second electrode 102 and the sense electrode 107 in accordance with the deflection of the piezoelectric layer 103, that is, the magnitude of the generated Coriolis force. The angular velocity ω applied to the angular velocity sensor 21 can be measured by measuring the magnitude of the potential difference.

The following relationship between a Coriolis force Fc and an angular velocity ω is true:

$$Fc = 2mv\omega$$

where v is the velocity of the oscillating vibration part 100*b* in the oscillation direction, and m is the mass of the vibration part 100*b*. As shown in this equation, the angular velocity ω can be calculated from the Coriolis force Fc.

[Piezoelectric Generating Element]

Figure 4:
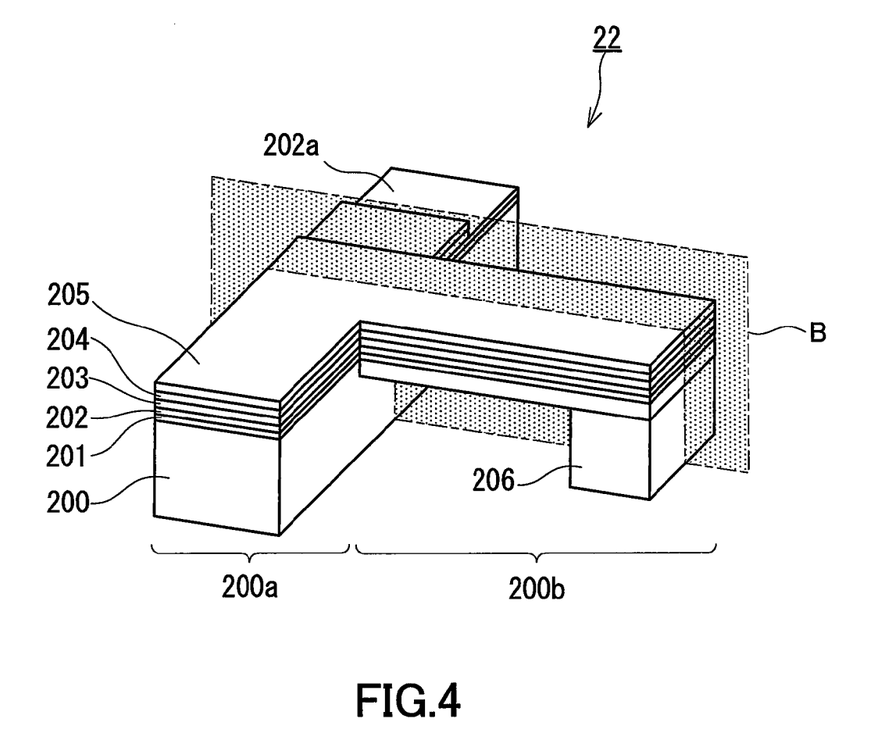
FIG. 4 is a perspective view schematically showing an example of a piezoelectric generating element of the present invention.
Figure 5:
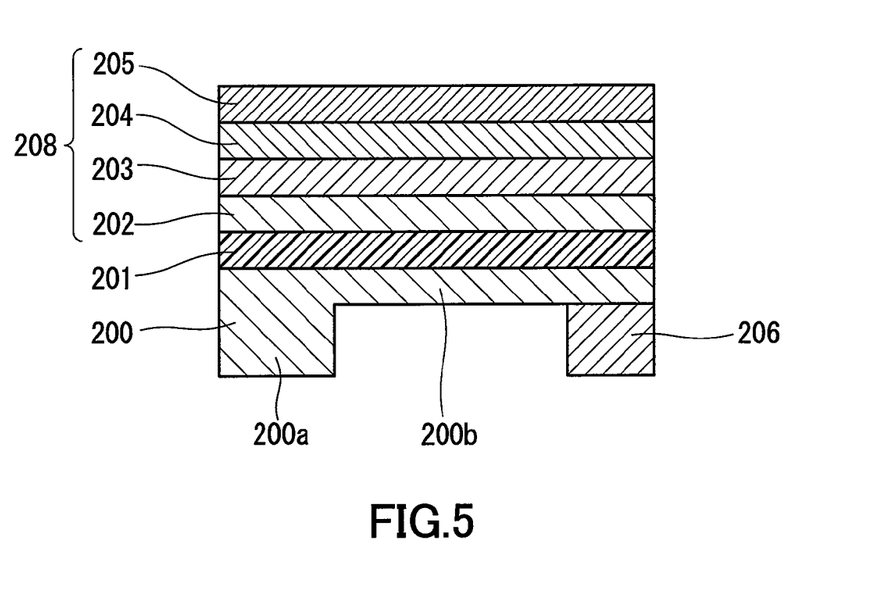
FIG. 5 is a cross-sectional view showing a cross section B of the piezoelectric generating element shown in FIG. 4.

FIGS. 4 and 5 show an example of a piezoelectric generating element of the present invention. FIG. 4 shows a cross section B of a piezoelectric generating element 22 shown in FIG. 3. The piezoelectric generating element 22 is an element that converts externally-applied mechanical vibration into electrical energy, and is used suitably in a self-sustained power supply for generating electric power from various vibrations such as engine vibrations and driving vibrations generated in vehicles and machines, and vibrations generated during walking.

The piezoelectric generating element 22 shown in FIGS. 4 and 5 includes a substrate 200 having a vibration part 200*b* and a piezoelectric thin film 208 bonded to the vibration part 200*b*.

The substrate 200 has a stationary part 200*a*, and a vibration part 200*b* having a beam extending in a predetermined direction from the stationary part 200*a*. The stationary part 200*a* and the vibration part 200*b* need not necessarily be made of the same material. The stationary part 200*a* and the vibration part 200*b* made of materials different from each other may be bonded to each other.

The material of the substrate 200 is not particularly limited. The material is, for example, silicon, glass, ceramic, or metal. The thickness of the substrate 200 may be any desired thickness as long as the functions of the piezoelectric generating element 22 develop. The thickness is, for example, 0.1 to 0.7 mm. The thickness of the stationary part 200*a* may be different from that of the vibration part 200*b*. The thickness of the vibration part 200*b* can be adjusted for efficient power generation by changing the resonance frequency of the vibration part 200*b*.

A weight load 206 for adjusting the resonance frequency of the vibration part 200*b* is joined to the vibration part 200*b*. The weight load 206 is, for example, a Ni-evaporated thin film. The material, shape, and mass of the weight load 206, as well as the position on the vibration part 200*b* to which the weight load 206 is joined may be adjusted according to a desired resonance frequency of the vibration part 200*b*. The weight load is not necessarily an essential component of the piezoelectric generating element of the present invention. The weight load may be omitted if the adjustment of the resonance frequency of the vibration part 200*b* is not necessary.

The piezoelectric thin film 208 is bonded to the vibration part 200*b* with an adhesive layer 201. The piezoelectric thin film 208 includes a piezoelectric layer 203, a first electrode 205 and a second electrode 202, and an interface layer 204. The piezoelectric layer 203 is sandwiched between the first electrode 205 and the second electrode 202. The interface layer 204 is placed between and in contact with the first electrode 205 and the piezoelectric layer 203.

The first electrode 205 in the piezoelectric thin film 208 is a metal electrode film having a plane orientation of (100). The interface layer 204 is a $(Bi,Na)TiO_3$ film. The piezoelectric layer 203 is a $(Bi,Na,Ba)TiO_3$ film. The first electrode 205, the interface layer 204, and the piezoelectric layer 203 in the piezoelectric thin film 208 correspond to the above-mentioned piezoelectric thin film 1 of the present invention. The piezoelectric thin film 208 has a structure including the piezoelectric thin film 1 and the second electrode 202 added thereto.

The first electrode 205 may be the same as the metal electrode film 12 described above in the explanation of the piezoelectric thin film of the present invention. The first electrode 205 is, for example, a Pt electrode film.

The second electrode 202 is not particularly limited as long as it has conductivity. The second electrode 202 is, for example, a Cu electrode (electrode film). The Cu electrode (electrode film) is preferable for the second electrode 202 because of its excellent adhesion to the piezoelectric layer 203. The second electrode may be a Pt electrode (film) or an Au electrode (film) having on its surface an adhesive layer made of a conductive material, such as Ti, having excellent adhesion to the piezoelectric layer 203.

In the example shown in FIGS. 4 and 5, a part of the second electrode 202 located on the stationary part 200*a* is exposed, and the exposed part serves as a connection terminal 202*a*.

The material of the adhesive layer 201 is not particularly limited as long as the adhesive layer 201 bonds stably the vibration part 200*b* of the substrate 200 to the piezoelectric thin film 208. For example, the material of the adhesive layer 201 is an acrylic resin adhesive, an epoxy resin adhesive, a silicone adhesive, or a polyimide adhesive.

In the piezoelectric generating element of the present invention, the preferred thicknesses of the adhesive layer 201, the second electrode 202, the piezoelectric layer 203, the interface layer 204, and the first electrode 205 are 0.2 to 1 μm, 0.1 to 0.5 μm, 0.5 to 5 μm, 0.05 to 0.5 μm, and 0.1 to 0.5 μm, respectively.

In the example shown in FIGS. 4 and 5, the piezoelectric layer 103, the interface layer 104, and the first electrode 105 are laminated in this order when viewed from the substrate 200 having the vibration part 200*b*. In the piezoelectric generating element of the present invention, however, the order of lamination of these layers may be reversed. Specifically, the first electrode, the interface layer, and the piezoelectric layer may be laminated in this order when viewed from the substrate having the vibration part.

In the example shown in FIGS. 4 and 5, the piezoelectric thin film 208 is bonded to both the vibration part 200b and the stationary part 200a of the substrate 200. In the piezoelectric generating element of the present invention, the piezoelectric thin film 208 may be bonded only to the vibration part 200b.

The piezoelectric generating element of the present invention may include a plurality of vibration parts 200b. In this case, an increased amount of electric power can be generated. In addition, such a piezoelectric generating element can be adapted to mechanical vibrations containing a wide range of frequency components by changing the resonance frequency of each of the plurality of vibration parts.

The piezoelectric generating element of the present invention may have an arbitrary layer or an arbitrary member at an arbitrary position, as long as the piezoelectric generating element includes the first electrode, the interface layer, and the piezoelectric layer that are laminated in this order and can generate electric power.

The above-mentioned manufacturing method of the piezoelectric thin film of the present invention can be applied to the manufacture of the piezoelectric generating element of the present invention. For example, the piezoelectric generating element can be manufactured in the following manner.

First, a metal electrode film having a plane orientation of (100) as a first electrode, a (Bi,Na)TiO$_3$ film as an interface layer, a (Bi,Na,Ba)TiO$_3$ film having a plane orientation of (001) as a piezoelectric layer, and a second electrode are formed on a base substrate in this order. The base substrate is, for example, a MgO substrate. The metal electrode film is, for example, a Pt electrode film. Well-known thin film formation techniques can be employed to form the respective layers. For example, they are formed by sputtering.

Next, a multilayer body thus formed is bonded to the substrate of a piezoelectric generating element via an adhesive layer. The substrate is, for example, a Si substrate. The multilayer body may be bonded to the substrate such that the substrate and an exposed layer of the multilayer body (a second electrode of the multilayer body formed as described above) on the side opposite to the base substrate are bonded to each other.

Next, the base substrate is removed by a technique such as etching. The etching is wet etching using phosphoric acid, for example. This etching may be performed at about 60° C.

Next, if necessary, the first electrode that has been exposed by removing the base substrate, the interface layer, the piezoelectric layer, and the second electrode are patterned using a microfabrication technique to form, for example, the connection terminal 202a. The substrate 200 is patterned using a technique such as dry etching to form the stationary part 200a and the vibration part 200b. In the case where the resonance frequency of the vibration part 200b needs to be adjusted, the weight load 206 may be bonded to the vibration part 200b. A well-known thin film microfacrication technique, such as etching, can be used as the above microfabrication. A well-known technique can be used to bond the weight load 206 to the vibration part 200b. The piezoelectric generating element of the present invention can be manufactured in this manner.

[Method of Generating Electrical Power Using Piezoelectric Generating Element]

A method of generating electric power using a piezoelectric generating element of the present invention is a method in which the above-described piezoelectric generating element is vibrated to obtain electric power through the first electrode and the second electrode of the element.

When mechanical vibration is applied externally to the piezoelectric generating element 22, the vibration part 200b starts vibrating to produce vertical deflection with respect to the stationary part 200a. The piezoelectric effect produced by the deflection generates an electromotive force across the piezoelectric layer 203, and as a result, a potential difference is generated between the first electrode 205 and the second electrode 202 that sandwich the piezoelectric layer 203 therebetween. The higher piezoelectric performance of the piezoelectric layer 203 generates a larger potential difference between the first and second electrodes, which enhances the electric power generation characteristics of the piezoelectric generating element 22. Particularly in the case where the resonance frequency of the vibration part 200b is close to the frequency of mechanical vibration to be applied externally to the element, the amplitude of the vibration part 200b increases and thus the electric power generation characteristics are improved. Therefore, the weight load 206 is preferably used to adjust the resonance frequency of the vibration part 200b to be close to the frequency of mechanical vibration applied externally to the element.

EXAMPLES

Hereinafter, the present invention is described in more detail with reference to an example. The present invention is not limited to the following example.

Example

In this example, a piezoelectric thin film having a structure shown in FIG. 1 was produced. The production procedure is as follows.

A Pt electrode film with a thickness of 250 nm was formed by RF magnetron sputtering on the surface, having a plane orientation of (100), of a monocrystalline MgO substrate. The Pt electrode film was formed using a metallic Pt target in an argon (Ar) gas atmosphere under the film formation conditions of an RF power of 15 W and a substrate temperature of 400° C.

Then, a (Bi$_{0.5}$Na$_{0.5}$)TiO$_3$ film with a thickness of 200 nm was formed as an interface layer by RF magnetron sputtering on the surface of the Pt electrode film thus formed. This (Bi$_{0.5}$Na$_{0.5}$)TiO$_3$ film was formed using (Bi$_{0.5}$Na$_{0.5}$)TiO$_3$ having a stoichiometric composition as a target in a mixed gas atmosphere of Ar and oxygen (with a flow ratio between Ar and O$_2$ of 50:50) under the film formation conditions of an RF power of 170 W and a substrate temperature of 650° C.

Then, a [(Bi$_{0.5}$Na$_{0.5}$)TiO$_3$]$_{0.93}$—[BaTiO$_3$]$_{0.07}$ film with a thickness of 2.7 μm was formed as a piezoelectric layer by RF magnetron sputtering on the surface of the (Bi$_{0.5}$Na$_{0.5}$)TiO$_3$ film thus formed. As a result, a piezoelectric thin film in which the MgO substrate, the Pt electrode film, the (Bi,Na)TiO$_3$ film, and the (Bi,Na,Ba)TiO$_3$ film were laminated in this order was obtained. This [(Bi$_{0.5}$Na$_{0.5}$)TiO$_3$]$_{0.93}$—[BaTiO$_3$]$_{0.07}$ film was formed using [(Bi$_{0.5}$Na$_{0.5}$)TiO$_3$]$_{0.93}$—[BaTiO$_3$]$_{0.07}$ having a stoichiometric composition as a target in a mixed gas atmosphere of Ar and oxygen (with a flow ratio between Ar and O$_2$ of 50:50) under the film formation conditions of an RF power of 170 W and a substrate temperature of 650° C.

Figure 6:
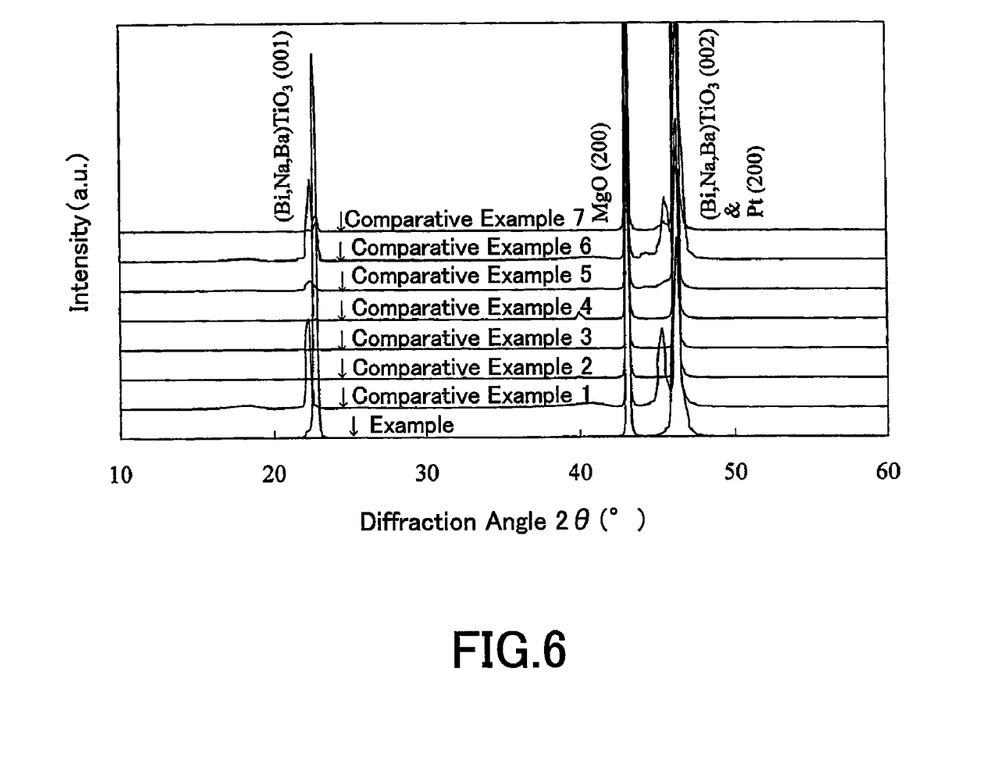
FIG. 6 is a diagram showing X-ray diffraction profiles of piezoelectric thin films produced in Example and Comparative Examples 1 to 7.

The [(Bi$_{0.5}$Na$_{0.5}$)TiO$_3$]$_{0.93}$—[BaTiO$_3$]$_{0.07}$ film ((Bi,Na,Ba)TiO$_3$ film) thus formed was subjected to an X-ray diffraction analysis to evaluate the crystal structure thereof. FIG. 6 shows the result thereof. The X-ray diffraction analysis was carried out in such a manner that the [(Bi$_{0.5}$Na$_{0.5}$)TiO$_3$]$_{1.93}$—[BaTiO$_3$]$_{0.07}$ film, which was laminated on the interface layer, the Pt electrode film, and the MgO substrate, was irradiated with an X-ray beam incident thereon. In Comparative Examples below, X-ray diffraction analyses were carried out in the same manner.

As shown in FIG. 6, the obtained X-ray diffraction profile showed only the reflection peak derived from the (001)-oriented (Bi,Na,Ba)TiO$_3$ film, except for the reflection peaks derived from the MgO substrate and the Pt electrode film. The profile also showed that the intensity of the peak derived from the (001)-oriented (Bi,Na,Ba)TiO$_3$ film was 134,959 cps, which was a very high level comparable to that of the peak derived from the MgO substrate, and therefore, it was confirmed that the degree of (001) orientation of the formed (Bi,Na,Ba)TiO$_3$ film was very high. The profile further showed that the Pt electrode film was (100)-oriented.

Subsequently, the half value width of the reflection peak derived from the (Bi,Na,Ba)TiO$_3$ film in the obtained X-ray diffraction profile was obtained by rocking curve measurement (in which the incident angle of the X-ray beam was scanned while the diffraction angle 2θ was fixed to the diffraction angle of the reflection peak to be measured). As a result, the obtained half value width was a very small value of 0.20°, and therefore it was confirmed that the crystallinity of (Bi,Na,Ba)TiO$_3$ in this film was extremely high. In Comparative Examples below, the half value widths of the reflection peaks were measured in the same manner.

Next, an Au electrode film with a thickness of 100 μm was formed by evaporation on the surface of the (Bi,Na,Ba)TiO$_3$ film thus formed. The ferroelectric properties and piezoelectric performance of the piezoelectric thin film thus obtained were evaluated using the Pt electrode film included in the piezoelectric thin film and the additionally formed Au electrode.

Figure 7:
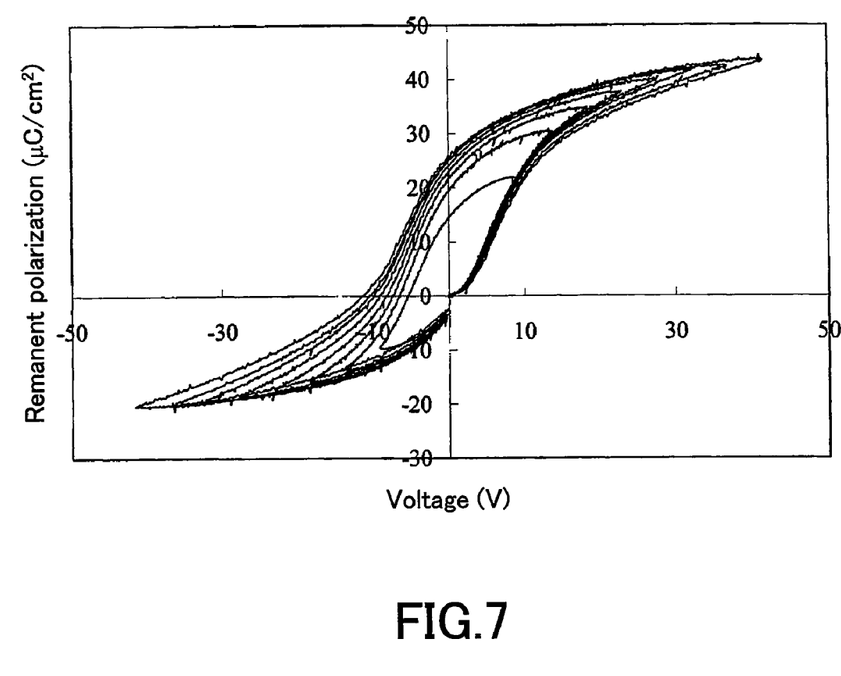
FIG. 7 is a diagram showing a P-E hysteresis loop of the piezoelectric thin film produced in Example.

FIG. 7 shows a P-E hysteresis loop of the produced piezoelectric thin film. As shown in FIG. 7, it was confirmed that the piezoelectric thin film exhibited better ferroelectric properties with an increase in the voltage applied to the piezoelectric layer through the Pt electrode film and the Au electrode film.

The piezoelectric performance of the piezoelectric thin film was evaluated in the following manner. The obtained piezoelectric thin film including the Au electrode film was cut into a strip with a width of 2 mm and worked into a cantilever shape. A potential difference was applied between the Pt electrode film and the Au electrode film, and the resulting displacement of the cantilever was measured with a laser displacement meter. Then, the measured displacement was converted into a piezoelectric constant d$_{31}$ to be evaluated. As a result of the evaluation, the piezoelectric constant d$_{31}$ of the produced piezoelectric thin film was −146 pC/N. In Comparative Examples below, the piezoelectric constants d$_{31}$ were evaluated in the same manner.

Comparative Example 1

Figure 8:
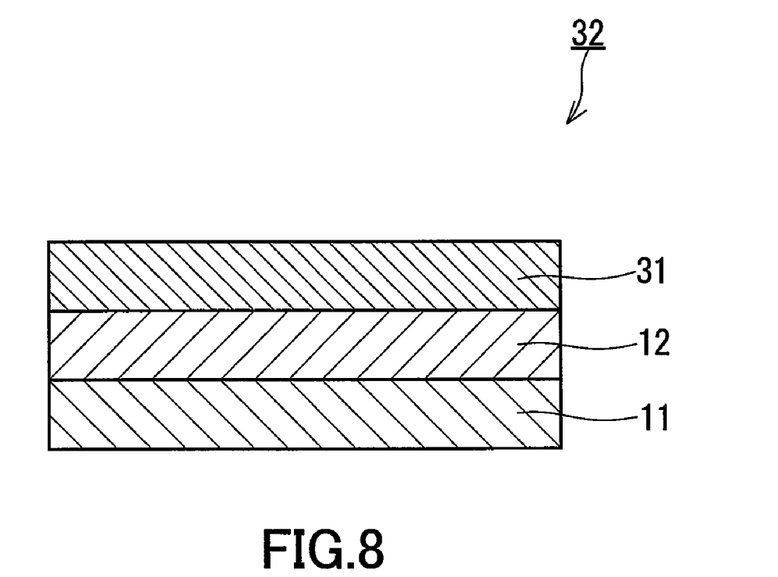
FIG. 8 is a cross-sectional view schematically showing a structure of the piezoelectric thin film produced in Comparative Example 1.

A piezoelectric thin film 32 as shown in FIG. 8, in which a MgO substrate 11, a Pt electrode film 12, and a (Bi,Na,Ba)TiO$_3$ film 31 as a piezoelectric layer were laminated in this order, was formed in the same manner as in Example except that a (Bi,Na)TiO$_3$ film as an interface layer was not formed.

FIG. 6 shows the result of the X-ray diffraction analysis of the formed (Bi,Na,Ba)TiO$_3$ film for the evaluation of the crystal structure thereof.

As shown in FIG. 6, the obtained X-ray diffraction profile showed the reflection peak derived from the (001)-oriented (Bi,Na,Ba)TiO$_3$ film. However, a plurality of reflection peaks derived from the other crystalline phases of the (Bi,Na,Ba)TiO$_3$ film were observed as well. In addition, the intensity of the above reflection peak in the (001) direction was 30,893 cps, which was a significantly lower level than the peak intensity (134,959 cps) in Example. This means that the orientation of the (Bi,Na,Ba)TiO$_3$ film in Comparative Example 1 was lower than that of the (Bi,Na,Ba)TiO$_3$ film in Example.

The half value width of the above reflection peak in the (001) direction was 0.86°, which was significantly greater than the width of 0.20° in Example. This means that the crystallinity of the (Bi,Na,Ba)TiO$_3$ film in Comparative Example 1 was lower than that of the (Bi,Na,Ba)TiO$_3$ film in Example.

Next, an Au electrode film with a thickness of 100 μm was formed by evaporation on the surface of the formed (Bi,Na,Ba)TiO$_3$ film. An attempt was made to evaluate the ferroelectric properties and piezoelectric performance of the piezoelectric thin film thus obtained using the Pt electrode film included in the piezoelectric thin film and the additionally formed Au electrode. However, a very large leak current in the piezoelectric thin film made it difficult to obtain a P-E hysteresis loop. It was also difficult to obtain an accurate value of a piezoelectric constant d$_{31}$ due to the leak current, but presumably, the piezoelectric constant d$_{31}$ was about −44 pC/N.

Comparative Examples 2 to 7

Figure 9:
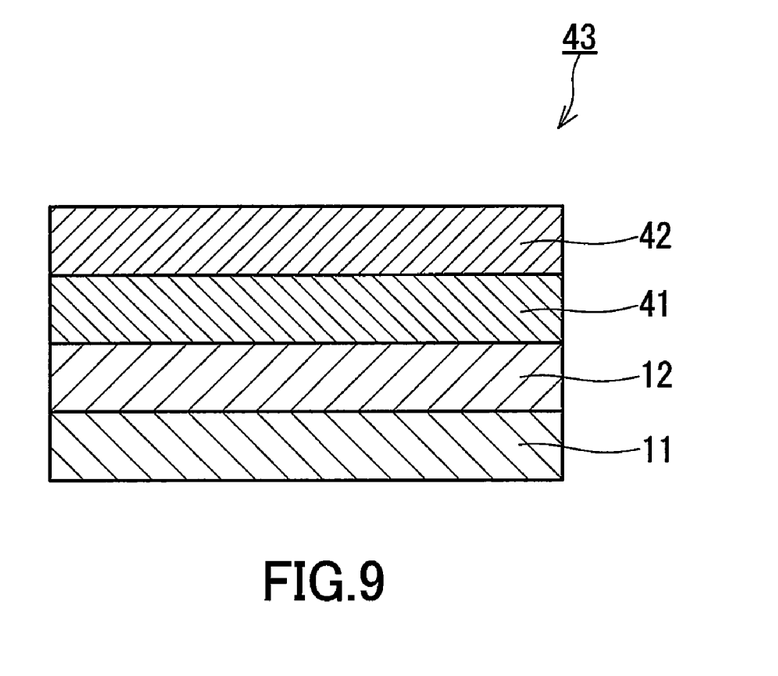
FIG. 9 is a cross-sectional view schematically showing a structure of the piezoelectric thin films produced in Comparative Examples 2 to 7.

In each of Comparative Examples 2 to 7, a piezoelectric thin film 43 as shown in FIG. 9, in which a MgO substrate 11, a Pt electrode film 12, an interface layer 41, and a (Bi,Na,Ba)TiO$_3$ film 42 as a piezoelectric layer were laminated in this order, was formed in the same manner as in Example except that the composition of the interface layer was different.

Comparative Example 2

A piezoelectric thin film was formed in the same manner as in Example except that a titanium oxide (TiO$_2$) film was formed as an interface layer on the surface of a Pt electrode film and a (Bi,Na,Ba)TiO$_3$ film was formed as a piezoelectric layer on the surface of the TiO$_2$ film. This TiO$_2$ film was formed by RF magnetron sputtering using TiO$_2$ as a target in a mixed gas atmosphere of Ar and oxygen (with a flow ratio between Ar and O$_2$ of 50:50) under the film formation conditions of an RF power of 170 W and a substrate temperature of 650° C. The thickness of the TiO$_2$ film was 200 nm.

FIG. 6 shows the result of the X-ray diffraction analysis of the formed (Bi,Na,Ba)TiO$_3$ film for the evaluation of the crystal structure thereof.

As shown in FIG. 6, the intensity of the reflection peak derived from the (001)-oriented (Bi,Na,Ba)TiO$_3$ film was almost zero, and no reflection peaks derived from the other crystal phases of the (Bi,Na,Ba)TiO$_3$ film were observed. Presumably, in Comparative Example 2, the (Bi,Na,Ba)TiO$_3$ film was in the randomly-oriented crystalline state.

In Comparative Example 2, the ferroelectric properties and piezoelectric performance of the piezoelectric thin film were not evaluated because the degree of orientation of the (Bi,Na,Ba)TiO$_3$ film was extremely low.

Comparative Example 3

A piezoelectric thin film was formed in the same manner as in Example except that a bismuth titanate (Bi$_4$Ti$_3$O$_{12}$) film was formed as an interface layer on the surface of a Pt electrode film and a (Bi,Na,Ba)TiO$_3$ film was formed as a piezoelectric layer on the surface of the Bi$_4$Ti$_3$O$_{12}$ film. This Bi$_4$Ti$_3$O$_{12}$ film was formed by RF magnetron sputtering using $Bi_4Ti_3O_{12}$ as a target in a mixed gas atmosphere of Ar and oxygen (with a flow ratio between Ar and $O_2$ of 50:50) under the film formation conditions of an RF power of 170 W and a substrate temperature of 650° C. The thickness of the $Bi_4Ti_3O_{12}$ film was 200 nm.

FIG. 6 shows the result of the X-ray diffraction analysis of the formed $(Bi,Na,Ba)TiO_3$ film for the evaluation of the crystal structure thereof.

As shown in FIG. 6, the intensity of the reflection peak derived from the (001)-oriented $(Bi,Na,Ba)TiO_3$ film was 111 cps, which was a very low level, and no reflection peaks derived from the other crystal phases of the $(Bi,Na,Ba)TiO_3$ film were observed. Presumably, in Comparative Example 3, the $(Bi,Na,Ba)TiO_3$ film was in the randomly-oriented crystalline state.

In Comparative Example 3, the ferroelectric properties and piezoelectric performance of the piezoelectric thin film were not evaluated because the degree of orientation of the $(Bi,Na,Ba)TiO_3$ film was extremely low.

Comparative Example 4

A piezoelectric thin film was formed in the same manner as in Example except that a sodium titanate $(Na_2TiO_3)$ film was formed as an interface layer on the surface of a Pt electrode film and a $(Bi,Na,Ba)TiO_3$ film was formed as a piezoelectric layer on the surface of the $Na_2TiO_3$ film. This $Na_2TiO_3$ film was formed by RF magnetron sputtering using $Na_2TiO_3$ as a target in a mixed gas atmosphere of Ar and oxygen (with a flow ratio between Ar and $O_2$ of 50:50) under the film formation conditions of an RF power of 170 W and a substrate temperature of 650° C. The thickness of the $Na_2TiO_3$ film was 200 nm.

FIG. 6 shows the result of the X-ray diffraction analysis of the formed $(Bi,Na,Ba)TiO_3$ film for the evaluation of the crystal structure thereof.

As shown in FIG. 6, the intensity of the reflection peak derived from the (001)-oriented $(Bi,Na,Ba)TiO_3$ film was 253 cps, which was a very low level. The reflection peaks derived from the other crystal phases of the $(Bi,Na,Ba)TiO_3$ film were observed but the intensities thereof were very low. Presumably, in Comparative Example 4, the $(Bi,Na,Ba)TiO_3$ film was in the randomly-oriented crystalline state.

In Comparative Example 4, the ferroelectric properties and piezoelectric performance of the piezoelectric thin film were not evaluated because the degree of orientation of the $(Bi,Na,Ba)TiO_3$ film was extremely low.

Comparative Example 5

A piezoelectric thin film was formed in the same manner as in Example except that a barium titanate $(BaTiO_3)$ film was formed as an interface layer on the surface of a Pt electrode film and a $(Bi,Na,Ba)TiO_3$ film was formed as a piezoelectric layer on the surface of the $BaTiO_3$ film. This $BaTiO_3$ film was formed by RF magnetron sputtering using $BaTiO_3$ as a target in a mixed gas atmosphere of Ar and oxygen (with a flow ratio between Ar and $O_2$ of 50:50) under the film formation conditions of an RF power of 170 W and a substrate temperature of 650° C. The thickness of the $BaTiO_3$ film was 200 nm.

FIG. 6 shows the result of the X-ray diffraction analysis of the formed $(Bi,Na,Ba)TiO_3$ film for the evaluation of the crystal structure thereof.

As shown in FIG. 6, the intensity of the reflection peak derived from the (001)-oriented $(Bi,Na,Ba)TiO_3$ film was 3,261 cps, and no reflection peaks derived from the other crystal phases of the $(Bi,Na,Ba)TiO_3$ film were observed. Presumably, in Comparative Example 5, the $(Bi,Na,Ba)TiO_3$ film was in the almost randomly-oriented crystalline state.

In Comparative Example 5, the ferroelectric properties and piezoelectric performance of the piezoelectric thin film were not evaluated because the degree of orientation of the $(Bi,Na,Ba)TiO_3$ film was extremely low.

Comparative Example 6

A piezoelectric thin film was formed in the same manner as in Example except that a barium-bismuth titanate $(Bi_4Ti_3O_{12}$—$BaTiO_3)$ film was formed as an interface layer on the surface of a Pt electrode film and a $(Bi,Na,Ba)TiO_3$ film was formed as a piezoelectric layer on the surface of the $Bi_4Ti_3O_{12}$—$BaTiO_3$ film. This $Bi_4Ti_3O_{12}$—$BaTiO_3$ film was formed by RF magnetron sputtering using $Bi_4Ti_3O_{12}$—$BaTiO_3$ synthesized from bismuth titanate $(Bi_4Ti_2O_{12})$ and barium titanate $(BaTiO_3)$, as a target, in a mixed gas atmosphere of Ar and oxygen (with a flow ratio between Ar and $O_2$ of 50:50) under the film formation conditions of an RF power of 170 W and a substrate temperature of 650° C. The thickness of the $Bi_4Ti_3O_{12}$—$BaTiO_3$ film was 200 nm.

FIG. 6 shows the result of the X-ray diffraction analysis of the formed $(Bi,Na,Ba)TiO_3$ film for the evaluation of the crystal structure thereof.

As shown in FIG. 6, the reflection peak derived from the (001)-oriented $(Bi,Na,Ba)TiO_3$ film was observed. However, a plurality of reflection peaks derived from the other crystalline phases of the $(Bi,Na,Ba)TiO_3$ film were observed as well. The intensity of the above reflection peak in the (001) direction was 27,131 cps, which was a significantly lower level than the reflection peak intensity (134,959 cps) in Example, and was also a lower level than that in Comparative Example 1 in which an interface layer was not included. This means that the orientation of the $(Bi,Na,Ba)TiO_3$ film in Comparative Example 6 was lower than that of the $(Bi,Na,Ba)TiO_3$ film in Example, and was also lower than that of the $(Bi,Na,Ba)TiO_3$ film in Comparative Example 1 in which an interface layer was not included.

In Comparative Example 6, the ferroelectric properties and piezoelectric performance of the piezoelectric thin film were not evaluated because the degree of orientation of the $(Bi,Na,Ba)TiO_3$ film was lower than that in Comparative Example 1.

Comparative Example 7

A piezoelectric thin film was formed in the same manner as in Example except that a sodium-barium titanate $(Na_2TiO_3$—$BaTiO_3)$ film was formed as an interface layer on the surface of a Pt electrode film and a $(Bi,Na,Ba)TiO_3$ film was formed as a piezoelectric layer on the surface of the $Na_2TiO_3$—$BaTiO_3$ film. This $Na_2TiO_3$—$BaTiO_3$ film was formed by RF magnetron sputtering using $Na_2TiO_3$—$BaTiO_3$ synthesized from sodium titanate $(Na_2TiO_3)$ and barium titanate $(BaTiO_3)$, as a target, in a mixed gas atmosphere of Ar and oxygen (with a flow ratio between Ar and $O_2$ of 50:50) under the film formation conditions of an RF power of 170 W and a substrate temperature of 650° C. The thickness of the $Na_2TiO_3$—$BaTiO_3$ film was 200 nm.

FIG. 6 shows the result of the X-ray diffraction analysis of the formed $(Bi,Na,Ba)TiO_3$ film for the evaluation of the crystal structure thereof.

As shown in FIG. 6, the intensity of the reflection peak derived from the (001)-oriented $(Bi,Na,Ba)TiO_3$ film was 5,600 cps, and no reflection peaks derived from the other crystal phases of the $(Bi,Na,Ba)TiO_3$ film were observed.

Presumably, in Comparative Example 7, the (Bi,Na,Ba)TiO$_3$ film was in the almost randomly-oriented crystalline state.

In Comparative Example 7, the ferroelectric properties and piezoelectric performance of the piezoelectric thin film were not evaluated because the degree of orientation of the (Bi,Na,Ba)TiO$_3$ film was extremely low.

Table 1 below shows collectively the evaluation results of Example and Comparative Examples 1 to 7.

TABLE 1

| | | (001) orientation and crystallinity of (Bi,Na,Ba)TiO$_3$ film | | |
|---|---|---|---|---|
| | Composition of interface layer | Peak intensity (cps) | Half value width (°) | Piezoelectric constant d$_{31}$ (pC/N) |
| Example | (Bi,Na)TiO$_3$ | 134,959 | 0.20 | −146 |
| Com. Example 1 | None (interface layer is not included) | 30,893 | 0.86 | −44 |
| Com. Example 2 | TiO$_2$ | 0 | — | — |
| Com. Example 3 | Bi$_4$Ti$_3$O$_{12}$ | 111 | — | — |
| Com. Example 4 | Na$_2$TiO$_3$ | 253 | — | — |
| Com. Example 5 | BaTiO$_3$ | 3,261 | — | — |
| Com. Example 6 | Bi$_4$Ti$_3$O$_{12}$—BaTiO$_3$ | 27,131 | — | — |
| Com. Example 7 | Na$_2$TiO$_3$—BaTiO$_3$ | 5,600 | — | — |

As shown in Table 1, a piezoelectric layer formed of a highly (001)-oriented (Bi,Na,Ba)TiO$_3$ film was formed only when a (Bi,Na)TiO$_3$ film was used as an interface layer. In the case where a film other than a (Bi,Na)TiO$_3$ film was used as an interface layer as in Comparative Examples 2 to 7, the crystallinity and orientation of the (Bi,Na,Ba)TiO$_3$ film deteriorated rather than the case where an interface layer was not included as in Comparative Example 1. That is, it was confirmed that the crystallinity and orientation of a piezoelectric layer do not improve just because an interface layer containing a part of the constituent metal elements of the piezoelectric layer is provided.

It was difficult to evaluate accurately the ferroelectric properties of the obtained piezoelectric thin film having no interface layer (Comparative Example 1) due to a very large leak current therein. Presumably, the piezoelectric constant d$_{31}$ thereof was about −44 pC/N. Furthermore, it is presumed, although not evaluated, that the ferroelectric properties obtained in Comparative Examples 2 to 7 were even lower than those in Comparative Example 1 because the orientation and crystallinity of the piezoelectric layers in Comparative Examples 2 to 7 were even lower than those in Comparative Example 1. In contrast, in Example, a good ferroelectric hysteresis loop was obtained because of a very small leak current. A large value of a piezoelectric constant d$_{31}$, that is, −146 pC/N, also was obtained, and high piezoelectric performance comparable to that of PZT was achieved, even though the piezoelectric layer contained no lead. It is reported that the piezoelectric constant d$_{31}$ of PZT is about −100 pC/N (−100 pm/V) (Eiji Fujii et al., IEEE Transactions on Ultrasonics, Ferroelectrics and Frequency Control, vol. 54, No. 12 (2007), pp. 2431-2438).

JP 2007-266346 A discloses a piezoelectric layer formed of a (Bi,Na,Ba)TiO$_3$ film. JP 10(1998)-182291 A describes in paragraph 0020 as follows: "It is more preferable to form an oxide layer as a buffer layer between the ferroelectric thin film and the substrate. Oxides usable for the buffer layer preferably contains all or a part of the elements constituting the ferroelectric thin film that is formed thereon". From this description, it is understood that metal oxides containing one, or two or more metal elements selected from Bi, Na, Ba, and Ti are preferably used as a buffer layer to form the (Bi,Na,Ba)TiO$_3$ film.

As shown in the present example, however, in the case where one of these oxides containing one of the metal elements (TiO$_2$ in Comparative Example 2) is used, the degree of crystal orientation of the resulting (Bi,Na,Ba)TiO$_3$ film is almost zero. Even if an oxide containing two of the metal elements (Comparative Examples 3 to 5) is used, the crystal orientation of the resulting (Bi,Na,Ba)TiO$_3$ film is low. Even if an oxide containing three of the metal elements is used, if the metal elements are a combination of Bi, Ba, and Ti (Comparative Example 6), or a combination of Na, Ba, and Ti (Comparative Example 7), the crystal orientation of the resulting (Bi,Na,Ba)TiO$_3$ film is low. In fact, the degrees of crystal orientation in these Comparative Examples are lower than the degree in Comparative Example 1 in which an interface layer is not included. Only in the case where a combination of Bi, Na, and Ti (Example) is used, a (Bi,Na,Ba)TiO$_3$ film having extremely high crystallinity and orientation can be obtained, as indicated by the peak intensity (134,959 cps) and the half value width (0.20°) of the resulting (Bi,Na,Ba)TiO$_3$ film in the X-ray diffraction profile thereof. That is, the present invention is not obvious from the inventions disclosed in these publications, and a person skilled in the art, who has access to these publications, could not arrive at the present invention.

The invention may be embodied in other forms without departing from the spirit or essential characteristics thereof. The embodiments disclosed in this specification are to be considered in all respects as illustrative and not limiting. The scope of the invention is indicated by the appended claims rather than by the foregoing description, and all changes which come within the meaning and range of equivalency of the claims are intended to be embraced therein.

Industrial Applicability

The (Bi,Na,Ba)TiO$_3$ piezoelectric layer of the piezoelectric thin film of the present invention has very high (001) orientation and crystallinity, and the piezoelectric thin film exhibits high ferroelectric properties and piezoelectric performance. The piezoelectric thin film of the present invention is useful as an alternative material to existing lead-containing oxide ferroelectrics, and can be used suitably for applications such as pyroelectric sensors and piezoelectric devices in which conventional piezoelectric thin films are used. Examples of such applications are an angular velocity sensor of the present invention and a piezoelectric generating element of the present invention.

The angular velocity sensor of the present invention has high sensitivity although it does not contain a lead-containing ferroelectric material such as PZT. The method of measuring an angular velocity of the present invention using this angular velocity sensor achieves high measurement sensitivity. Furthermore, the piezoelectric generating element of the present invention has excellent electric power generation characteristics although it does not contain a lead-containing ferroelectric material such as PZT. The method of generating electric power of the present invention using this piezoelectric generating element achieves high electric power generation efficiency. These angular velocity sensor and piezoelectric generating element, and these angular velocity measurement method and electric power generation method can be widely applied to various fields and uses.

What is claimed is:

1. A piezoelectric thin film comprising: a metal electrode film having a plane orientation of (100); a (Bi,Na)TiO$_3$ film; and a (Bi,Na,Ba)TiO$_3$ film having a plane orientation of (001), the piezoelectric thin film having a multilayer structure in which the metal electrode film, the (Bi,Na)TiO$_3$ film, and the (Bi,Na,Ba)TiO$_3$ film are laminated in this order.

2. The piezoelectric thin film according to claim 1, wherein the metal electrode film is composed of platinum (Pt).

3. The piezoelectric thin film according to claim 1, further comprising a substrate,
wherein the metal electrode film is formed on the substrate.

4. The piezoelectric thin film according to claim 3, wherein the substrate is composed of magnesium oxide (MgO).

5. A method of manufacturing a piezoelectric thin film, the method comprising steps of: forming a (Bi,Na)TiO$_3$ film on a surface of a metal electrode film having a plane orientation of (100) by sputtering; and
forming a (Bi,Na,Ba)TiO$_3$ film having a plane orientation of (001) on the (Bi,Na)TiO$_3$ film by sputtering to obtain a piezoelectric thin film having a multilayer structure in which the metal electrode film, the (Bi,Na)TiO$_3$ film, and the (Bi,Na,Ba)TiO$_3$ film are laminated in this order.

6. The method of manufacturing a piezoelectric thin film according to claim 5, wherein the metal electrode film is composed of platinum (Pt).

7. The method of manufacturing a piezoelectric thin film according to claim 5, wherein the metal electrode film is formed on a substrate.

8. The method of manufacturing a piezoelectric thin film according to claim 7, wherein the substrate is composed of magnesium oxide (MgO).

9. An angular velocity sensor comprising: a substrate having a vibration part; and a piezoelectric thin film bonded to the vibration part,
wherein the piezoelectric thin film includes: a piezoelectric layer; first and second electrodes that sandwich the piezoelectric layer therebetween; and an interface layer sandwiched between the first electrode and the piezoelectric layer,
the first electrode is formed of a metal electrode film having a plane orientation of (100),
the interface layer is formed of a (Bi,Na)TiO$_3$ film,
the piezoelectric layer is formed of a (Bi,Na,Ba)TiO$_3$ film having a plane orientation of (001), and
one of the first and second electrodes selected therefrom is constituted of an electrode group including: a drive electrode for applying a driving voltage that oscillates the vibration part to the piezoelectric layer; and a sense electrode for measuring a deformation of the vibration part caused by an angular velocity applied to the oscillating vibration part.

10. The angular velocity sensor according to claim 9, wherein the metal electrode film is composed of platinum (Pt).

11. A piezoelectric generating element comprising: a substrate having a vibration part; and a piezoelectric thin film bonded to the vibration part,
wherein the piezoelectric thin film includes: a piezoelectric layer; first and second electrodes that sandwich the piezoelectric layer therebetween; and an interface layer sandwiched between the first electrode and the piezoelectric layer,
the first electrode is formed of a metal electrode film having a plane orientation of (100),
the interface layer is formed of a (Bi,Na)TiO$_3$ film, and
the piezoelectric layer is formed of a (Bi,Na,Ba)TiO$_3$ film having a plane orientation of (001).

12. The piezoelectric generating element according to claim 11, wherein the metal electrode film is composed of platinum (Pt).

13. A method of generating electric power using a piezoelectric generating element, comprising:
preparing the piezoelectric generating element including a substrate having a vibration part and a piezoelectric thin film bonded to the vibration part, wherein,
the piezoelectric thin film includes: a piezoelectric layer; first and second electrodes that sandwich the piezoelectric layer therebetween; and an interface layer sandwiched between the first electrode and the piezoelectric layer,
the first electrode is formed of a metal electrode film having a plane orientation of (100),
the interface layer is formed of a (Bi,Na)TiO$_3$ film, and
the piezoelectric layer is formed of a (Bi,Na,Ba)TiO$_3$ film having a plane orientation of (001); and
vibrating the vibration part to obtain electric power through the first and second electrodes.

14. The method of generating electric power using a piezoelectric generating element according to claim 13, wherein the metal electrode film is composed of platinum (Pt).

* * * * *